(12) United States Patent
Macioβek et al.

(10) Patent No.: US 9,963,797 B2
(45) Date of Patent: May 8, 2018

(54) COPPER ELECTROPLATING METHOD

(71) Applicant: Atotech Deutschland GmbH, Berlin (DE)

(72) Inventors: Andreas Macioβek, Berlin (DE); Olivier Mann, Berlin (DE); Pamela Cebulla, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days. days.

(21) Appl. No.: 15/031,317

(22) PCT Filed: Oct. 9, 2014

(86) PCT No.: PCT/EP2014/071630
§ 371 (c)(1),
(2) Date: Apr. 22, 2016

(87) PCT Pub. No.: WO2015/058963
PCT Pub. Date: Apr. 30, 2015

(65) Prior Publication Data
US 2016/0258077 A1    Sep. 8, 2016

(30) Foreign Application Priority Data

Oct. 22, 2013    (EP) .................................... 13189652

(51) Int. Cl.
*C25D 5/18*    (2006.01)
*C25D 7/12*    (2006.01)
(Continued)

(52) U.S. Cl.
CPC ................. *C25D 5/02* (2013.01); *C25D 3/38* (2013.01); *C25D 5/022* (2013.01); *C25D 5/18* (2013.01);
(Continued)

(58) Field of Classification Search
CPC .... C25D 3/00–3/665; C25D 5/00–5/56; C25D 7/00–7/126; C25D 15/00–15/02; C25D 17/00–17/28; C25D 21/00–21/22
See application file for complete search history.

(56) References Cited

U.S. PATENT DOCUMENTS

| 5,972,192 | A | 10/1999 | Dubin et al. |
| 2003/0010642 | A1* | 1/2003 | Taylor .................... C25D 5/18 205/103 |

(Continued)

FOREIGN PATENT DOCUMENTS

| EP | 1330146 | 7/2003 |
| WO | 2012103357 | 8/2012 |

OTHER PUBLICATIONS

PCT/EP2014/071630; PCT International Search Report and Written Opinion of the International Searching Authority dated Dec. 19, 2014.

(Continued)

*Primary Examiner* — Bryan D. Rippa
*Assistant Examiner* — Ho-Sung Chung
(74) *Attorney, Agent, or Firm* — Renner, Otto, Boisselle & Sklar, LLP

(57) ABSTRACT

The method for copper electroplating according to the present invention comprises an aqueous acidic copper plating bath containing a leveler additive which forms copper trenches having a cross-sectional round shape under direct current plating conditions, and at least one reverse current pulse cycle consisting of one forward current pulse and one reverse current pulse wherein the fraction of the reverse charge to the forward charge applied to the substrate in said at least one current pulse cycle ranges between 0.1 to 5%. The method is particularly suitable for simultaneously filling blind micro vias and plating trenches with a rectangular cross-sectional shape.

21 Claims, 9 Drawing Sheets

(51) Int. Cl.
  *C25D 3/38* (2006.01)
  *C25D 5/02* (2006.01)
  *C25D 5/56* (2006.01)
  *C25D 17/00* (2006.01)
  *C25D 17/10* (2006.01)
  *C25D 21/18* (2006.01)

(52) U.S. Cl.
  CPC ............... *C25D 5/56* (2013.01); *C25D 7/123* (2013.01); *C25D 17/001* (2013.01); *C25D 17/10* (2013.01); *C25D 21/18* (2013.01); *H05K 2201/09509* (2013.01)

(56) References Cited

U.S. PATENT DOCUMENTS

| | | | |
|---|---|---|---|
| 2003/0221967 A1 | 12/2003 | Tsuchida et al. | |
| 2003/0221969 A1* | 12/2003 | Tomisaka | C25D 3/38 205/298 |
| 2004/0187731 A1* | 9/2004 | Wang | C25D 3/38 106/1.13 |
| 2009/0301889 A1* | 12/2009 | Reents | C25D 3/38 205/96 |
| 2010/0126872 A1 | 5/2010 | Paneccasio, Jr. et al. | |
| 2010/0307925 A1* | 12/2010 | Kondo | C25D 3/38 205/103 |
| 2011/0011746 A1* | 1/2011 | Brunner | C25D 3/38 205/125 |
| 2014/0120722 A1 | 5/2014 | Richardson et al. | |

OTHER PUBLICATIONS

PCT/EP2014/071630; PCT International Preliminary Report on Patentability dated Mar. 11, 2016.
PCT/EP2014/071630; PCT Written Opinion of the International Preliminary Examining Authority dated Oct. 12, 2015.
Search Report for corresponding Chinese Application No. 201480058528.2 dated Apr. 19, 2017.

* cited by examiner

COPPER ELECTROPLATING METHOD

The present application is a U.S. National Stage Application based on and claiming benefit and priority under 35 U.S.C. § 371 of International Application No. PCT/EP2014/071630, filed 9 Oct. 2014, which in turn claims benefit of and priority to European Application No. 13189652.4 filed 22 Oct. 2013, the entirety of both of which is hereby incorporated herein by reference.

FIELD OF THE INVENTION

The present invention relates to a copper electroplating method for combined blind micro via filling and trench plating in the manufacture of printed circuit boards, IC substrates and the like.

BACKGROUND OF THE INVENTION

Electroplating of copper is a common technique in the manufacture of electronic components such as printed circuit boards and IC substrates. Different types of features in a multilayer laminate such as blind micro vias (BMVs) and recessed structures in a patterned resist layer need to be completely filled with copper. Copper filled recessed structures in patterned resist layers are referred herein as trenches.

With an ongoing miniaturization of such features in electronic components electroplating of copper becomes more demanding. The diameter of BMVs is getting smaller and at the same time their aspect ratio is increased. The line width and interline distance of trenches is reduced to 50 μm or even below 10 or 5 μm.

Accordingly, the requirements for BMV filling with copper are increased. At the same time, also the requirements for the cross-sectional shape of trenches are increased. Cross-sectional trench shapes such as ski-slope shaped trenches (2) (FIG. 1) and round shaped trenches (3) (FIG. 2) (round edges) are not sufficient anymore in terms of e.g. current propagation. A rectangular cross-sectional shape of trenches (4) on a substrate surface (1) is desired (FIG. 3).

It is also highly desired for economical reasons to electroplate different features such as BMVss and trenches in one step while fulfilling the required filling quality of BMVss and obtaining the rectangular cross-sectional shape of trenches.

Filling of BMVs' with copper by electroplating under reverse pulse plating conditions is for example disclosed in US 2009/0301889 A1. The method disclosed in this document leads to a sufficient filling of BMVs' with copper but the cross-sectional line shapes of trenches plated at the same time is not always sufficient.

OBJECTIVE OF THE PRESENT INVENTION

It is the objective of the present invention to provide a method for simultaneous filling of BMVs' and plating of trenches with a rectangular cross-sectional shape with copper by electroplating.

SUMMARY OF THE INVENTION

This objective is solved by a method for copper electroplating comprising, in this order, the steps of
(i) providing a substrate comprising blind micro vias and a patterned resist layer having openings for trench formation and an aqueous acidic copper electrolyte,
(ii) operating said substrate as a cathode which is in contact with at least one anode and contacting said substrate with said aqueous acidic copper electrolyte comprising a leveler additive wherein the leveler additive forms copper trenches having a cross-sectional round shape under direct current plating conditions and,
(iii) applying to the substrate an electrical current, comprising at least one current pulse cycle consisting of one forward current pulse and one reverse current pulse and wherein the fraction of the reverse charge to the forward charge applied to the substrate in said at least one pulse cycle ranges from 0.1 to 5%,
and thereby filling the blind micro vias with copper and forming copper trenches having a rectangular cross-sectional shape.

DETAILED DESCRIPTION OF THE INVENTION

Figure 1:
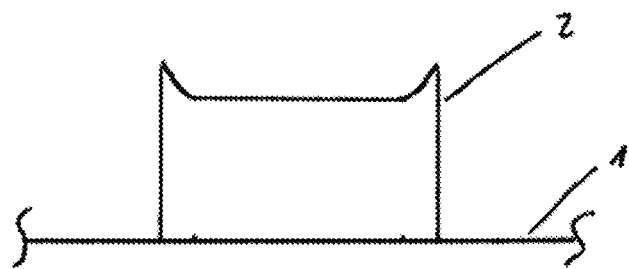
FIG. 1 shows schematically the cross-section of a trench having an undesired ski-slope shape.

The method for electroplating of copper according to the present invention concerns the simultaneous filling of BMVs' and formation of trenches having a rectangular cross-sectional shape.

This method relies on the combination of a) an aqueous acidic copper plating bath comprising a leveler additive which produces trenches having a (cross-sectional) round shape under DC (direct current) plating conditions (FIG. 2) and preferably a metal ion redox system, and b) the application of an electrical current comprising at least one current pulse cycle which consists of a long forward pulse and a very short reverse pulse.

In order to electroplate copper on a non-conductive substrate surface (1), a conductive seed layer formed on the non-conductive surface is required to initiate the electroplating of copper. In general, the seed layer is for example formed by electroless deposition of copper. The seed metal layer is electrically conductive, provides adhesion and permits the exposed portions of its upper surface to be electroplated.

The dielectric walls of BMVs' are subjected to a cleaning process in order to remove smear and other residues derived from methods such as mechanical drilling, laser drilling, plasma etching and spark erosion. The cleaning process can be either a wet chemical desmear or a plasma desmear process. Such methods are known in the art (e.g.: C. F. Coombs, Jr., "Printed Circuits Handbook", 2001, Chapter 28.4, pages 28.5 to 28.7).

A wet chemical desmear process comprises the steps of a) swelling the dielectric surfaces of the dielectric layers, b) etching the dielectric surfaces of the dielectric layers with a permanganate solution and c) removing $MnO_2$ from the dielectric surfaces of the dielectric layers by chemical reduction.

Next, the dielectric surface of the BMVs' is activated by conventional methods such as electroless plating of copper or by a direct plating method. Such methods are also known in the art (e.g.: C. F. Coombs, Jr., "Printed Circuits Handbook", 5th Ed. 2001, Chapter 28.5, pages 28.7 to 28.10).

The aqueous acidic copper plating bath according to the method of the present invention comprises a source of copper ions, an acid, an organic brightener additive, a carrier additive, halide ions and a leveler additive. Said leveler additive produces trenches having a round shape under DC plating conditions. Preferred further ingredients are a metal ion redox system and surfactants.

Copper ions are added to the plating bath as a water-soluble copper salt. Preferably, the source of copper ions is selected from copper sulfate pentahydrate, a copper sulfate solution or copper methane sulfonate. The concentration of copper ions in the plating bath ranges from 15 to 75 g/l, more preferably from 40 to 60 g/l.

The at least one acid is selected from the group comprising sulfuric acid, fluoro boric acid and methane sulfonic acid. The concentration of the at least one acid in the plating bath ranges from 20 to 400 g/l and more preferably from 40 to 300 g/l.

In case sulfuric acid is used as an acid, it is added in form of a 50 to 96 wt.-% solution. Most preferably, 60 to 120 g/l of a 50 wt.-% solution of sulfuric acid is added to the plating bath.

The organic brightener additives are selected from sulfur containing compounds such as thiol-, sulfide-, disulfide- and polysulfide-compounds (U.S. Pat. No. 4,975,159). Preferred brightener additives are selected from the group comprising 3-(benzthiazolyl-2-thio)-propylsulfonic-acid, 3-mercapto-propan-1-sulfonic-acid, ethylendithiodipropylsulfonic-acid, bis-(p-sulfophenyl)-disulfide, bis-(ω-sulfobutyl)-disulfide, bis-(ω-sulfohydroxypropyl)-disulfide, bis-(ω-sulfopropyl)-disulfide, bis-(ω-sulfopropyl)-sulfide, methyl-(ω-sulfopropyl)-disulfide, methyl-(ω-sulfopropyl)-trisulfide, O-ethyl-dithiocarbonic-acid-S-(ω-sulfopropyl)-ester, thioglycol-acid, thiophosphoric-acid-O-ethyl-bis-(ω-sulfopropyl)-ester, thiophosphoric-acid-tris-(ω-sulfopropyl)-ester and their corresponding salts. The concentration of the brightener additive present in the aqueous acidic copper plating bath ranges from 0.005 mg/l to 200 mg/l, more preferably from 0.01 to 100 mg/l and most preferably from 0.05 to 50 mg/l.

The acidic copper plating bath further contains at least one carrier additive which is usually a polyalkyleneglycol compound (U.S. Pat. No. 4,975,159) and is selected from the group comprising polyvinylalcohol, carboxymethylcellulose, polyethyleneglycol, polypropyleneglycol, stearic acid polyglycolester, oleic acid polyglycolester, stearylalcohol-polyglycolether, nonylphenolpolyglycolether, octanolpoly-alkyleneglycolether, octanediol-bis-(polyalkyleneglycolether), poly(ethyleneglycol-ran-propyleneglycol), poly(ethylenglycol)-block-poly(propylenglycol)-block-poly(ethylenglycol), poly(propylenglycol)-block-poly(ethylenglycol)-block-poly(propylenglycol). The concentration of said carrier additives ranges from 0.005 g/l to 20 g/l, more preferably from 0.01 g/l to 5 g/l.

Halide ions may be added to the acidic copper plating bath in the form of a alkali metal salt or the corresponding acid. The concentration of halide ions in the plating bath preferably ranges from 20 to 200 mg/l, more preferably from 30 to 100 mg/l and most preferably from 35 to 75 mg/l. Chloride ions are the most preferred halide ions and sodium chloride and diluted hydrochloric acid are the most preferred sources for chloride ions.

Figure 2:
FIG. 2 shows schematically the cross-section of a trench having a round shape.
Figure 3:
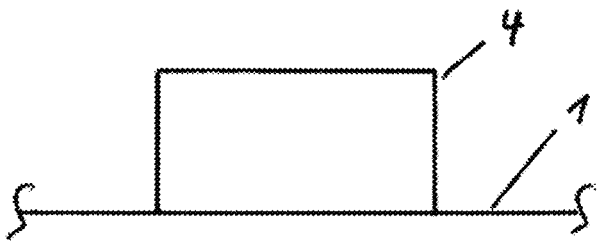
FIG. 3 shows schematically the cross-section of a trench having a desired rectangular shape.

The desired rectangular cross-sectional shape of copper plated trenches (3) (FIG. 3) is achieved with the method according to the present invention if the leveler additive present in the copper plating bath generates a cross-sectional shape of copper filled trenches under DC (direct current) plating conditions which is referred to as "round shape" (FIG. 2). Leveler additives which produce a "ski-slope shaped" trench (FIG. 1) under DC plating conditions are not suitable as the sole leveler additive for the method according to the present invention.

Suitable DC plating conditions for determining a leveler additive which produces trenches having a (cross-sectional) round shape "under DC plating conditions" are for example applying a direct current having a current density in the range of 1 to 5 A/dm² for 30 to 60 min at 20 to 30° C. to the substrate having trenches to be plated with copper.

A person skilled in the art is able to distinguish between a leveler additive which generates "ski-slope shaped" and "round-shaped" trenches under DC plating conditions (Examples 1, 3 and 6).

Leveler additives which generate a "round-shaped" trench (3) under DC plating conditions and which are suitable for the method according to the present invention are for example ureylene polymers.

One specific type of such ureylene polymers is disclosed in EP 12194261 and which comprises a structural element according to formula (I) and/or formula (II)

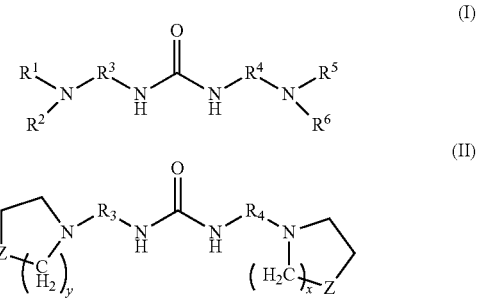

wherein R1, R2, R5, and R6 are independently selected from the group consisting of hydrogen, a substituted or unsubstituted hydrocarbon residue with 1 to 10 carbon atoms, preferably methyl, ethyl, hydroxyethyl or —$CH_2CH_2$($OCH_2CH_2$)$_a$—OH, wherein a is an integer from 0 to 4, and R3 and R4 are independently selected from the group consisting of ($CH_2$)$_p$, wherein p is an integer from 2 to 12, preferably for an ethylene or propylene group, or for a —[CH$_2$CH$_2$O]$_m$—CH$_2$CH$_2$— group, wherein m is an integer from 1 to 40, preferably for a —(CH$_2$)$_2$—O—(CH$_2$)$_2$— or —(CH$_2$)$_2$—O—(CH$_2$)$_2$—O—(CH$_2$)$_2$— group, Z may be the same or different and represents O or S, preferably, Z is the same, most preferably, Z is O, x and y may be the same or different and are preferably an integer selected from 1, 2 and 3, more preferably x and y are both 2.

Also the ureylene polymer poly[bis(2-chloroethyl)ether]-alt-1,3-bis[3-dimethylamino)propyl]urea (CAS-No. 68555-36-2) forms trenches having a round shape when plating under DC plating conditions.

Another example for leveler additives which generate the desired "round-shaped" trenches under DC plating conditions and which are suitable for the method according to the present invention are peptides and/or amino acids which are functionalized with polyalkylene glycol and/or polyalkylene imine and/or polyvinyl alcohol residues. Such leveler additives are disclosed in US 2011/0011746 A1.

Leveler additives which generate "ski-slope shaped" trenches (2) under DC plating conditions and which are not preferred as the sole leveler additive in the method according to the present invention are for example polyvinylpyrrolidone and copolymers comprising vinylpyrrolidone monomers such as Luviquat® FC 370, Luviquat® MS 370, Luviquat® Hold and Luviquat® Excellence (products of BASF SE), Luviskol® Plus (polyvinyl-ε-caprolactam, a product of BASF SE), polyvinylpyridine, 5-phenyl-1H-1,2,4-triazole-3-thiol and other molecular azole derivatives.

In one embodiment of the present invention, the aqueous acidic copper plating bath comprises at least one leveler additive which generates "round-shaped" trenches under DC plating conditions and at least one leveler additive which generates "ski-slope shaped" or rectangular shaped trenches under DC plating conditions are combined.

The leveler additive is added to the copper plating bath in amounts of 0.01 to 200 mg/l, more preferably from 0.05 to 100 mg/l and most preferably from 0.1 to 50 mg/l.

The plating method according to the present invention utilizes defined parameters for the electrical current which is applied to the substrate during copper plating:

Said electrical current comprises at least one current pulse cycle consisting of one forward current pulse and one reverse current pulse. Said electrical current applied to said substrate can also be expressed as a charge which is obtained by multiplying the current provided in Ampere with the time (in milliseconds) during which said current is applied to said substrate. Accordingly, the unit of said charge is Ampere—milliseconds.

The duration of the reverse current pulse is preferably not more than 5%, more preferably not more than 1% and most preferably not more than 0.5% of the forward pulse duration in said at least one current pulse cycle.

The duration of the forward current pulse in said at least one current pulse cycle preferably ranges from 10 to 1000 ms, more preferably from 20 to 500 ms and most preferably from 40 to 200 ms.

The current density of the forward current pulse in said at least one current pulse cycle preferably ranges from 0.5 to 10 A/dm$^2$, more preferably from 1 to 8 A/dm$^2$ and most preferably from 2 to 6 A/dm$^2$.

The duration of the reverse current pulse in said at least one current pulse cycle preferably ranges from 0.05 to 1 ms, more preferably from 0.1 to 0.8 ms and most preferably from 0.1 to 0.5 ms.

The current density of the reverse current pulse in said at least one current pulse cycle preferably ranges from 5 to 100 A/dm$^2$, more preferably from 10 to 80 A/dm$^2$ and most preferably from 20 to 60 A/dm$^2$.

The "forward charge" FC is defined herein by the current of the forward pulse applied to the substrate (in Ampere) multiplied by the duration of said forward pulse (in milliseconds) during said at least one current pulse.

The "reverse charge" RC is defined herein by the current of the reverse pulse applied to the substrate (in Ampere) multiplied by the duration of said reverse pulse (in milliseconds) during said at least one current pulse cycle.

The "fraction of the reverse charge to the forward charge applied to the substrate during said at least one current pulse cycle" FRCFC is defined herein as the ratio of the "reverse charge" RC and the "forward charge" FC applied to the substrate, multiplied by 100, and is provided in "%":

$$FRCFC = \frac{RC}{FC} \cdot 100$$

The "fraction of the reverse charge to the forward charge applied to the substrate in said at least one current pulse cycle" in accordance with the method according to the present invention ranges from 0.1 to 5%, preferably from 0.5 to 4% and more preferably from 1 to 3%.

In one embodiment of the present invention, the electrical current applied to the substrate in addition comprises also application of a direct current (DC plating conditions) to the substrate before and/or after said at least one current pulse cycle consisting of one forward current pulse and one reverse current pulse. Filling of BMVs' can be even more improved in this embodiment.

In another embodiment of the present invention, the electrical current applied to the substrate in addition comprises at least one further current pulse cycle consisting of one forward current pulse and one reverse current pulse wherein the fraction of said reverse charge to the forward charge applied to said substrate in said at least one further current pulse cycle is more than 5%. Said further current pulse cycle can be applied before and/or after the at least one current pulse cycle wherein the fraction of reverse current to the forward charge applied to the substrate ranges from 0.1 to 5%. Filling of BMVs' can be even more improved in this embodiment.

In still another embodiment of the present invention, the electrical current applied to the substrate in addition comprises at least one further current pulse cycle consisting of one forward current pulse and one reverse current pulse wherein the fraction of said reverse charge applied to said substrate in said at least one current pulse cycle is more than 5%, and also application of a direct current (DC plating conditions) to the substrate.

Both inert anodes and soluble anodes can be used as anodes in the method according to the present invention. Soluble anodes may be passivated when applying a higher current density of e.g. 5 A/dm$^2$ to the substrate.

Accordingly, at least one inert anode is preferably used instead of at least one soluble anode. Suitable inert anodes are for example titanium anodes coated with iridium oxides and/or a platinum metal group element or alloy thereof.

Particularly preferred in the aqueous acidic copper plating bath is a metal ion redox system consisting of ferrous and ferric ions. In this case, 0.1 g/l to 4.0 g/l, preferably 0.5 to 3.0 g/l and most preferably 0.8 to 1.5 g/l of ferric ions are present in the plating bath. The concentration of ferrous ions in the plating bath preferably ranges from 4 to 20 g/l, more preferably from 5 to 14 g/l and most preferably from 6 to 8 g/l.

The metal ion redox system consisting of ferrous and ferric ions is also automatically formed if only ferrous ions are added to the acidic copper plating bath composition.

Most preferably, at least one inert anode is used together with a metal ion redox system in the aqueous acidic copper electrolyte for the method according to the present invention. Said combination enables a desirable stable operation of the method for copper plating according to the present invention.

When using inert anodes, copper ions are replenished during use of the acidic copper ions by dissolving metallic copper by oxidation in the presence of ferric ions in a separate container ("copper ion generator") connected to the plating equipment. Metallic copper can be for example provided in the form of pellets, pieces and spheres. At the same time, ferric ions are reduced to ferrous ions. Both copper ions and ferrous ions are returned to the plating equipment using pumps.

The method according to the present invention can be operated in conveyorized horizontal and (conveyorized) vertical plating equipment.

The method for copper electroplating according to the present invention is suitable for simultaneous filling of BMVs' and plating of trenches having a rectangular cross-sectional shape.

EXAMPLES

A plating bath stock solution comprising 60 g/l copper ions, 80 g/l sulfuric acid, 4 ml/l of a brightener additive (organic sulfur compound), a carrier additive (polyethylene glycol) and 40 mg/l chloride ions was used throughout all examples. Different leveler additives were added to said stock solution prior to the plating experiments.

The substrate (1) used throughout all examples was a reinforced epoxy resin base layer with BMVs' having a diameter of 100 μm and a depth of 90 μm and a patterned resist layer having trench openings of 50 to 200 μm width. All surface areas of the substrate (1) which should be electroplated with copper comprised copper as a plating base.

The impact of three different plating conditions on the shape of copper filled trenches was investigated:
1. DC (direct current plating conditions)
2. Conventional RPP (reverse pulse plating)
3. RPP according to the present invention.

Example 1 (Comparative)

6 ml/l of Luviskol® Plus (polyvinyl-ε-caprolactam, a product of BASF SE) were added to the plating bath stock solution.

Trenches having a width in the range of 50 to 200 μm were copper plated and BMVs' filled simultaneously with DC plating conditions (1.3 A/dm$^2$, 60 min plating time at 25° C.).

Figure 4:
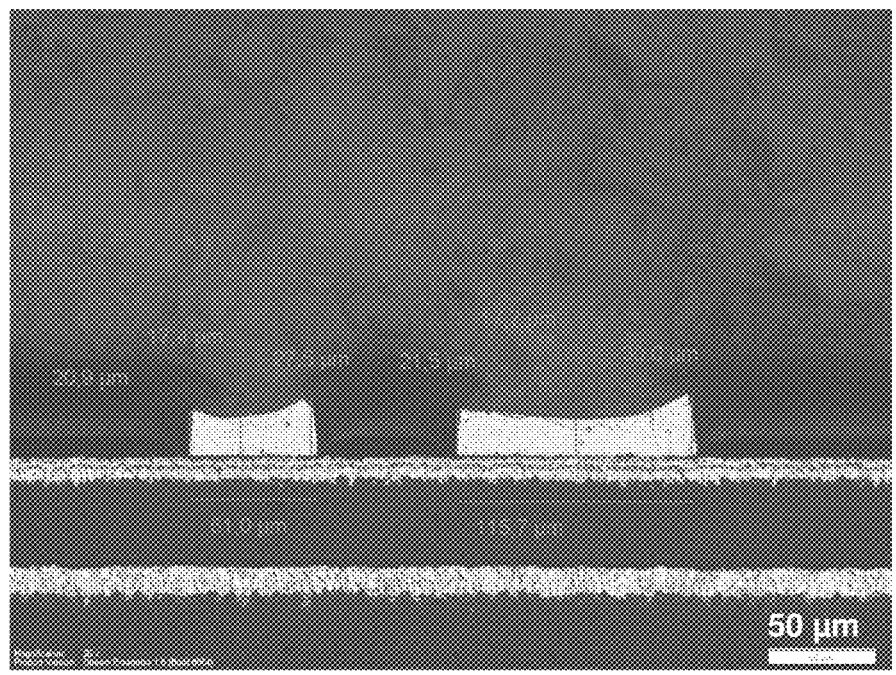
FIG. 4 shows a micrograph of the cross-section of a trench having an undesired ski-slope shape obtained from Example 1.

The micrograph of a cross-section obtained from the substrate after plating is shown in FIG. 4. The trench has an undesired "ski-slope shape" when applying DC plating conditions.

Example 2 (Comparative)

The same trench structure together with BMVs' were plated in the same plating bath composition used in Example 1 under reverse (current) pulse plating conditions. Each cycle of the pulse sequence consisted of a single 1.3 A/dm$^2$ forward pulse for 160 ms followed by a single 35 A/dm$^2$ reverse pulse with a duration of 0.2 ms. The fraction of reverse charge to the forward charge applied to the substrate during said current pulse cycle was 3.4%.

Figure 5:
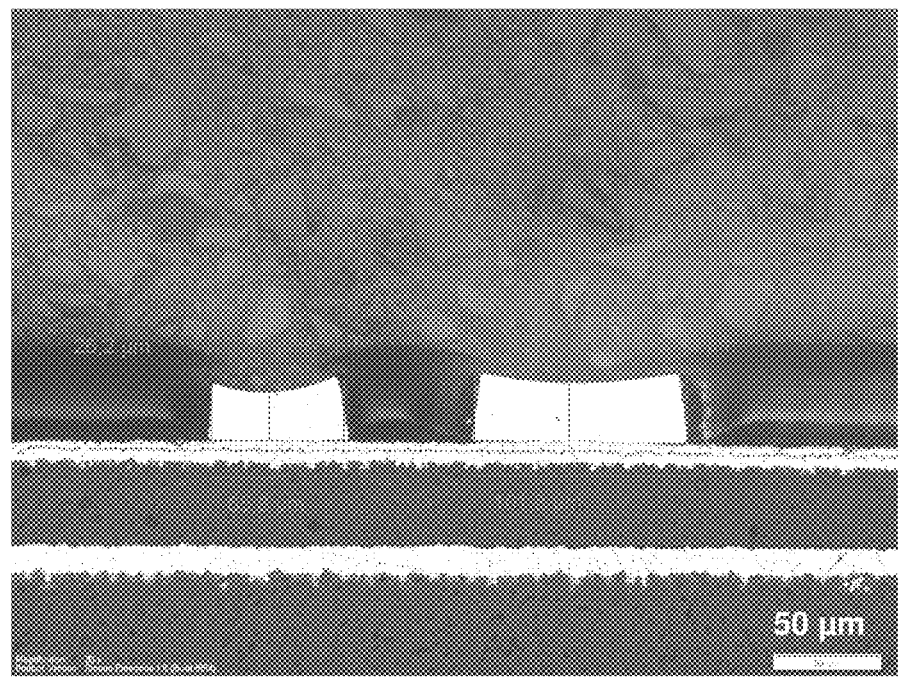
FIG. 5 shows a micrograph of the cross-section of a trench having an undesired ski-slope shape obtained from Example 2.

The micrograph of a cross-section obtained from the substrate after plating is shown in FIG. 5. The BMV filling is sufficient but the trench has an undesired "ski-slope shape" when applying reverse (current) pulse plating conditions according to the present invention.

Example 3 (Comparative)

4 ml/l of a synthetically produced amino acid functionalized with a polyethyleneglycol residue were added to the plating bath stock solution. Such leveler additives are disclosed in US 2011/0011746 A1 and their preparation in F. M. Veronese, "Peptide and protein PEGylation: a review of problems and solutions", Biomaterials 22 (2001) 405-417.

Trenches having a width of 50 to 200 μm were plated and BMVs' filled simultaneously with DC plating conditions (5 A/dm$^2$, 33 min plating time at 30° C.).

Figure 6:
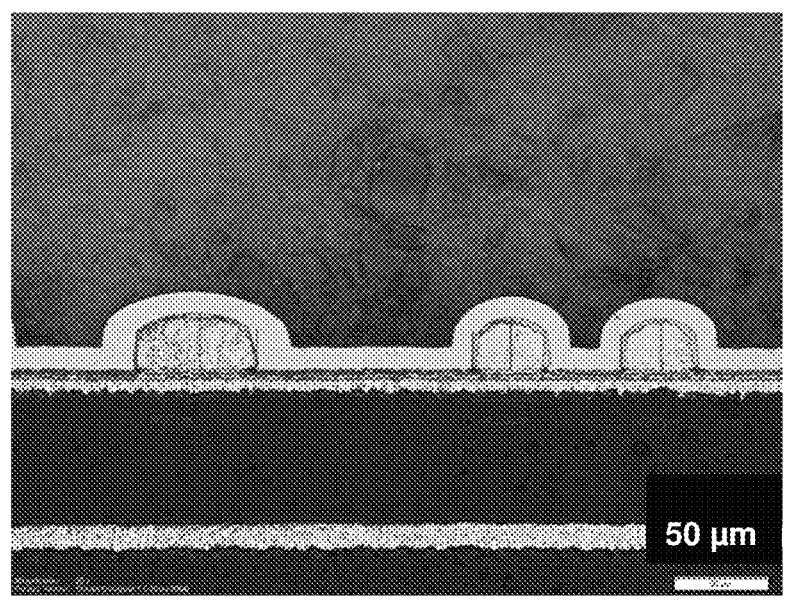
FIG. 6 shows a micrograph of the cross-section of a trench having a round shape obtained from Example 3.

The micrograph of a cross-section obtained from the substrate after plating is shown in FIG. 6. The trench has the desired "round shape" when applying DC plating conditions. Hence, the leveler additive employed is in accordance with a suitable leveler additive in the copper electroplating method according to the present invention.

Example 4 (Comparative)

The same trench structure was plated and the same BMVs' were filled in the plating bath composition used in Example 3 under reverse (current) pulse plating conditions. Each cycle of the pulse sequence consisted of a single 5 A/dm$^2$ forward pulse for 80 m s followed by a single 60 A/dm$^2$ reverse pulse with a duration of 1 ms.

Hence, the fraction of reverse charge to the forward charge applied to the substrate during said current pulse cycle was 15.0% within each pulse cycle and the RPP parameters applied are considered conventional.

Figure 7:
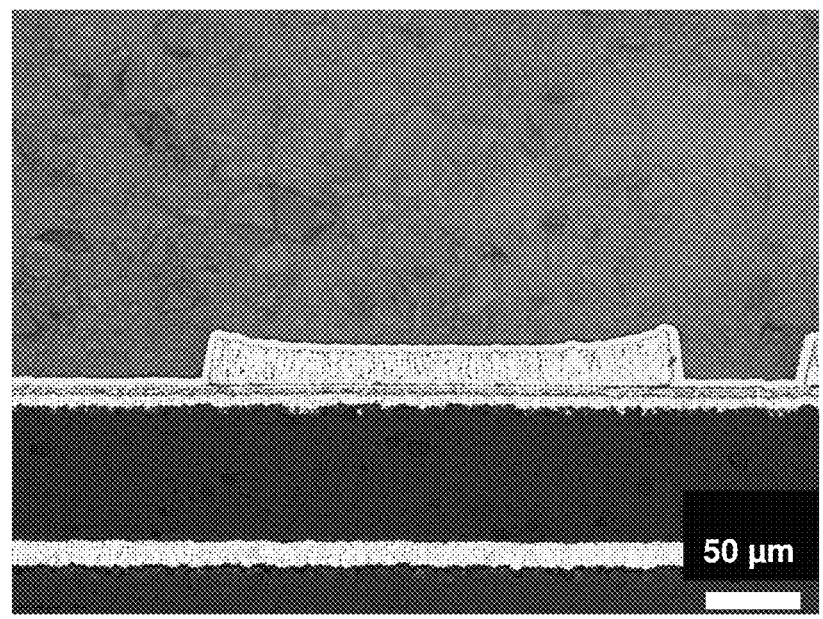
FIG. 7 shows a micrograph of the cross-section of a trench having an undesired ski-slope shape obtained from Example 4.

The micrograph of a cross-section obtained from the substrate after plating is shown in FIG. 7. The BMV filling is sufficient but the trench has an undesired "ski-slope shape".

Example 5 (Invention)

The same trench structure was plated and the same BMVs' filled in the plating bath composition used in Examples 3 and 4 under reverse (current) pulse plating conditions according to the present invention. Each cycle of the pulse sequence consisted of a single 5 A/dm$^2$ forward pulse for 80 ms followed by a single 60 A/dm$^2$ reverse pulse with a duration of 0.3 ms. The fraction of reverse charge to the forward charge applied to the substrate during said current pulse cycle was 4.5%.

Figure 8:
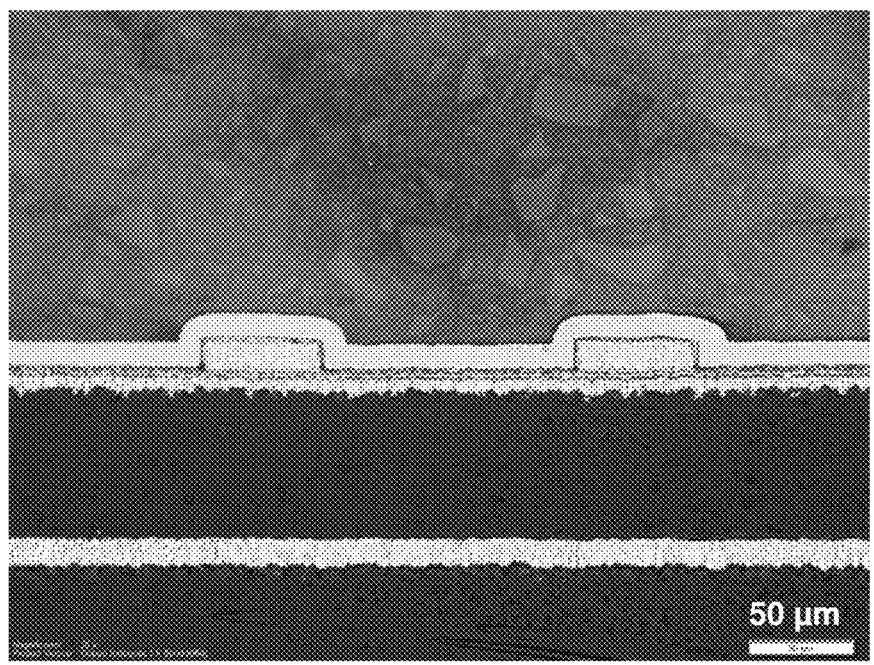
FIG. 8 shows a micrograph of the cross-section of a trench having the desired rectangular shape obtained from Example 5.

The micrograph of a cross-section obtained from the substrate after plating is shown in FIG. 8. The BMV filling is sufficient and the trench has the desired "rectangular shape" when applying reverse (current) pulse plating conditions according to the present invention.

Example 6 (Comparative)

6 ml/l of an ureylene polymer were added to the plating bath stock solution as the leveler additive. The preparation of said ureylene polymer is disclosed in WO 2011/029781 A1, preparation example 12.

Trenches having a width of 50 to 200 μm were plated and BMVs' filled simultaneously with DC plating conditions (5 A/dm², 33 min plating time at 30° C.).

Figure 9:
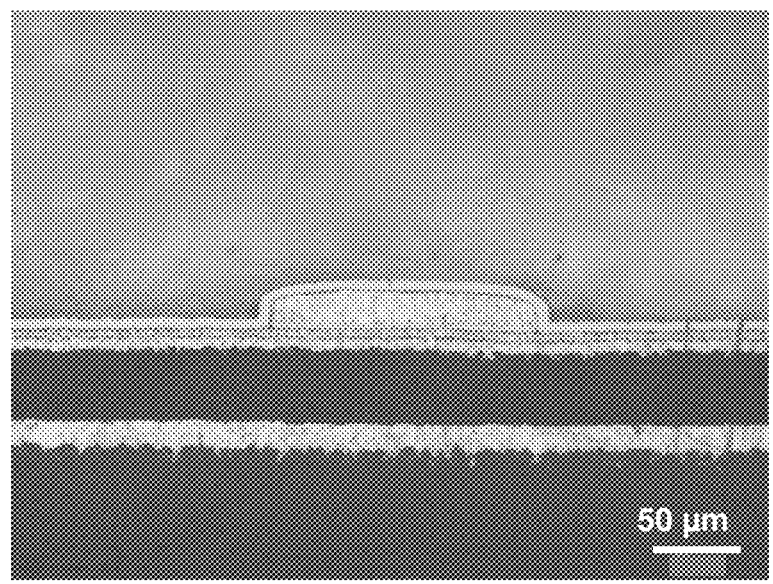
FIG. 9 shows a micrograph of the cross-section of a trench having a round shape obtained from Example 6.

The micrograph of a cross-section obtained from the substrate after plating is shown in FIG. 9. The trench has the desired "round shape" when applying DC plating conditions.

Example 7 (Invention)

The same trench structure was plated and the same BMVs' filled in the plating bath composition used in Example 6 under reverse (current) pulse plating conditions according to the present invention. Each cycle of the pulse sequence consisted of a single 3.3 A/dm² forward pulse for 160 ms followed by a single 50 A/dm² reverse pulse with a duration of 0.2 ms. The fraction of reverse charge to the forward charge applied to the substrate in said current pulse cycle was 1.9%.

Figure 10:
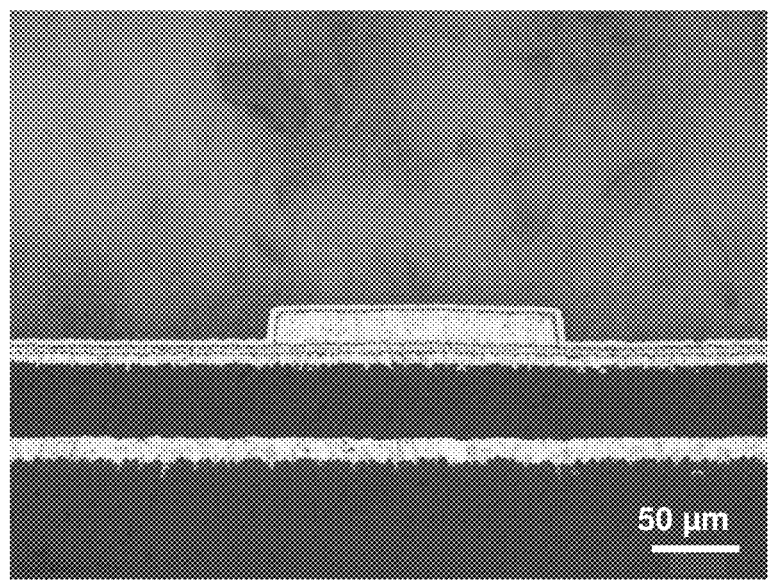
FIG. 10 shows a micrograph of the cross-section of a trench having the desired rectangular shape obtained from Example 7.

The micrograph of a cross-section obtained from the substrate after plating is shown in FIG. 10. The BMV filling is sufficient and the trench has the desired "rectangular shape" when applying reverse pulse plating conditions according to the present invention.

Example 8 (Comparative)

The same trench structure was plated and the same BMVs' filled in the plating bath composition used in Example 6 under conventional reverse (current) pulse plating conditions. Each cycle of the pulse sequence consisted of a single 4.4 A/dm² forward pulse for 100 ms followed by a single 30 A/dm² reverse pulse with a duration of 4 ms. The fraction of reverse charge to the forward charge applied to the substrate in said current pulse cycle was 27%.

Figure 11:
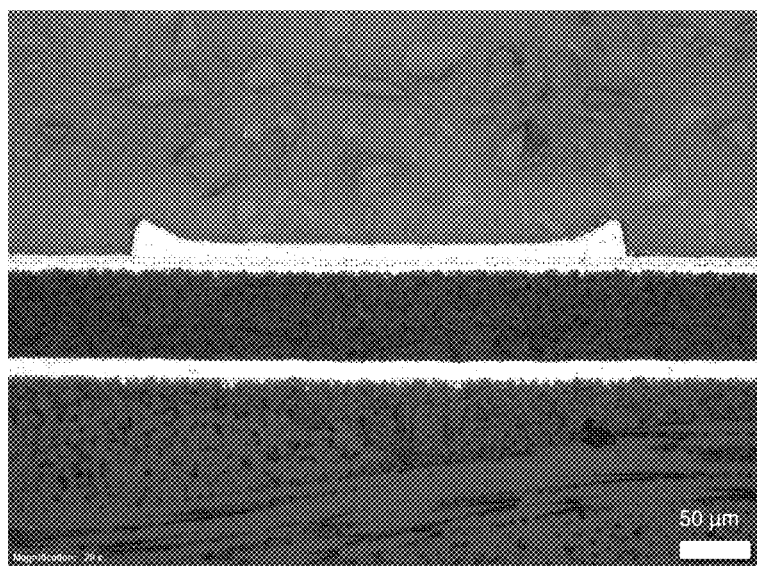
FIG. 11 shows a micrograph of a trench having an undesired ski-slope shape obtained from Example 8.

The micrograph of a cross-section obtained from the substrate after plating is shown in FIG. 11. The BMV filling not sufficient and the trench has an undesired "ski-slope shape".

The conditions and results of examples 1 to 8 are summarized in Table 1:

| Example No. | Plating conditions | Plating cond. in accordance with invention | Cross-sectional trench shape |
| --- | --- | --- | --- |
| 1 | DC*⁾ | no | ski-slope |
| 2 | RPP**⁾ | yes | ski-slope |
| 3 | DC | no | round |
| 4 | RPP | no | ski-slope |
| 5 | RPP | yes | rectangular |
| 6 | DC | no | round |
| 7 | RPP | yes | rectangular |
| 8 | RPP | no | ski-slope |

*⁾DC = direct current plating
**⁾RPP = reverse pulse plating

The invention claimed is:

1. A method for copper electroplating comprising, in this order, the steps of
   (i) providing a substrate comprising blind micro vias and a patterned resist layer having openings for trench formation and an aqueous acidic copper electrolyte comprising a leveler additive wherein the leveler additive is selected from the group consisting of ureylene polymers, aminocarboxylic acids functionalized with polyalkylene glycol residues, aminocarboxylic acids functionalized with polyalkylene imine residues, aminocarboxylic acids functionalized with polyvinyl alcohol residues, peptides functionalized with polyalkylene glycol residues, peptides functionalized with polyalkylene imine residues and peptides functionalized with polyvinyl alcohol residues,
   (ii) operating said substrate as a cathode which is in contact with at least one anode and contacting said substrate with said aqueous acidic copper electrolyte, and,
   (iii) applying to the substrate an electrical current, comprising at least one current pulse cycle consisting of one forward current pulse and one reverse current pulse and wherein the fraction of reverse charge to the forward charge applied to said substrate in said at least one current pulse cycle ranges from 0.1 to 5%,
   wherein
      the duration of the forward current pulse in said at least one current pulse cycle ranges from 10 to 1000 ms,
      the duration of the reverse current pulse in said at least one current pulse cycle ranges from 0.05 to 1 ms, and
      the current density of the reverse current pulse in said at least one current cycle ranges from 20 to 100 A/dm²,
   wherein the applying fills the blind micro vias with copper and forms copper trenches having a rectangular cross-sectional shape, and
   wherein the duration of the reverse current pulse is not more than 0.5% of the duration of the forward current pulse in said at least one current pulse cycle.

2. The method for copper electroplating according to claim 1 wherein the fraction of the reverse charge to the forward charge applied to the substrate in said at least one current pulse cycle ranges from 0.5 to 4%.

3. The method for copper electroplating according to claim 1 wherein the fraction of the reverse charge to the forward charge applied to the substrate in said at least one current pulse cycle ranges from 1 to 3%.

4. The method for copper electroplating according to claim 1 wherein the at least one anode is an inert anode.

5. The method for copper electroplating according to claim 1 wherein the aqueous acidic copper electrolyte further comprises a metal ion redox system.

6. The method for copper electroplating according to claim 5 wherein the metal ion redox system consists of ferrous and ferric ions.

7. The method for copper electroplating according to claim 6 wherein the concentration of ferric ions ranges from 0.1 to 4.0 g/l.

8. The method for copper electroplating according to claim 5 wherein the at least one anode is an inert anode.

9. The method for copper electroplating according to claim 1 wherein the concentration of the leveler additive ranges from 0.01 to 200 mg/l.

10. The method for copper electroplating according to claim 1 wherein the current density of the forward current pulse in said at least one current pulse cycle ranges from 0.5 to 10 A/dm².

11. The method for copper electroplating according to claim 6 wherein the at least one anode is an inert anode.

12. The method for copper electroplating according to claim 7 wherein the at least one anode is an inert anode.

13. The method for copper electroplating according to claim 2 wherein the aqueous acidic copper electrolyte further comprises a metal ion redox system.

14. The method for copper electroplating according to claim 3 wherein the aqueous acidic copper electrolyte further comprises a metal ion redox system.

15. The method for copper electroplating according to claim 4 wherein the aqueous acidic copper electrolyte further comprises a metal ion redox system.

16. The method for copper electroplating according to claim 1 wherein the duration of the reverse current pulse in said at least one current pulse cycle ranges from 0.1 to 0.8 ms.

17. The method for copper electroplating according to claim 1 wherein the wherein the current density of the forward current pulse in said at least one current pulse cycle ranges from 1 to 8 A/dm$^2$ and the duration of the reverse current pulse in said at least one current pulse cycle ranges from 0.1 to 0.8 ms.

18. The method for copper electroplating according to claim 10 wherein the wherein the current density of the forward current pulse in said at least one current pulse cycle ranges from 1 to 8 A/dm$^2$ and the duration of the reverse current pulse in said at least one current pulse cycle ranges from 0.1 to 0.8 ms.

19. The method for copper electroplating according to claim 1 wherein in (iii) each pulse cycle consists of one forward current pulse and one reverse current pulse.

20. A method for copper electroplating comprising, in this order, the steps of
   (i) providing a substrate comprising blind micro vias and a patterned resist layer having openings for trench formation and an aqueous acidic copper electrolyte comprising a leveler additive wherein the leveler additive is selected from the group consisting of ureylene polymers,
   (ii) operating said substrate as a cathode which is in contact with at least one anode and contacting said substrate with said aqueous acidic copper electrolyte, and,
   (iii) applying to the substrate an electrical current, comprising at least one current pulse cycle consisting of one forward current pulse and one reverse current pulse and wherein the fraction of reverse charge to the forward charge applied to said substrate in said at least one current pulse cycle ranges from 0.1 to 5%,
   wherein
      the duration of the forward current pulse in said at least one current pulse cycle ranges from 10 to 1000 ms,
      the duration of the reverse current pulse in said at least one current pulse cycle ranges from 0.05 to 1 ms, and
      the current density of the reverse current pulse in said at least one current cycle ranges from 20 to 100 A/dm$^2$,
   wherein the applying fills the blind micro vias with copper and forms copper trenches having a rectangular cross-sectional shape, and wherein the duration of the reverse current pulse is not more than 0.5% of the duration of the forward current pulse in said at least one current pulse cycle.

21. The method for copper electroplating according to claim 20 wherein the current density of the forward current pulse in said at least one current pulse cycle ranges from 0.5 to 10 A/dm$^2$.

* * * * *